US009171625B2

(12) United States Patent
Sakui et al.

(10) Patent No.: US 9,171,625 B2
(45) Date of Patent: Oct. 27, 2015

(54) APPARATUSES AND METHODS TO MODIFY PILLAR POTENTIAL

(75) Inventors: Koji Sakui, Tokyo (JP); Peter Sean Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 602 days.

(21) Appl. No.: 13/525,035

(22) Filed: Jun. 15, 2012

(65) Prior Publication Data

US 2013/0336070 A1 Dec. 19, 2013

(51) Int. Cl.
*G11C 16/06* (2006.01)
*G11C 16/10* (2006.01)
*G11C 16/04* (2006.01)
*G11C 16/02* (2006.01)

(52) U.S. Cl.
CPC ............. *G11C 16/10* (2013.01); *G11C 16/02* (2013.01); *G11C 16/0466* (2013.01); *G11C 16/0483* (2013.01)

(58) Field of Classification Search
CPC ........ G11C 16/02; G11C 16/06; G11C 16/10; G11C 16/0466; H01L 29/788
USPC ............. 365/185.11, 185.22, 185.17, 185.05; 257/315
See application file for complete search history.

(56) References Cited

U.S. PATENT DOCUMENTS

| 7,075,828 | B2 | 7/2006 | Lue et al. |
| 7,301,818 | B2 | 11/2007 | Lu et al. |
| 7,642,156 | B2 | 1/2010 | Kim |
| 7,764,544 | B2 | 7/2010 | Mokhlesi |
| 7,924,612 | B2 | 4/2011 | Kashimura |
| 2005/0128810 | A1 | 6/2005 | Lutze et al. |
| 2007/0004099 | A1 | 1/2007 | Choi et al. |
| 2007/0246750 | A1 | 10/2007 | Azuma |
| 2009/0109761 | A1 | 4/2009 | Jin et al. |
| 2011/0002172 | A1* | 1/2011 | Kito et al. ................ 365/185.18 |
| 2011/0103153 | A1 | 5/2011 | Katsumata et al. |
| 2011/0182122 | A1 | 7/2011 | Marquart |
| 2011/0216604 | A1 | 9/2011 | Mikajiri et al. |

(Continued)

FOREIGN PATENT DOCUMENTS

| JP | 3171768 A | 7/1991 |
| WO | WO-2007126807 A1 | 11/2007 |

(Continued)

OTHER PUBLICATIONS

Briaire, J, et al., "Principles of Substrate Crosstalk Generation in CMOS Circuits", IEEE Transactions on Computer-Aided Design of Integrated Circuits and Systems, vol. 19, No. 6, (Jun. 2000), 645-653.

(Continued)

*Primary Examiner* — Toan Le
(74) *Attorney, Agent, or Firm* — Schwegman Lundberg & Woessner, P.A.

(57) ABSTRACT

Apparatus are disclosed, such as a block including a number of strings of charge storage devices, each string including a number of charge storage devices associated with a pillar, and each pillar including semiconductor material. Methods are disclosed, such as a method that includes performing a first operation on a first charge storage device associated with a pillar in the block, modifying an electrical potential of the pillar, and performing a second operation on a second charge storage device in the block. Additional apparatus and methods are described.

35 Claims, 12 Drawing Sheets

(56) References Cited

U.S. PATENT DOCUMENTS

| | | |
|---|---|---|
| 2011/0242893 A1 | 10/2011 | Chen et al. |
| 2012/0008400 A1 | 1/2012 | Fukuzumi et al. |
| 2012/0009747 A1* | 1/2012 | Kang et al. .................... 438/268 |
| 2012/0120740 A1* | 5/2012 | Shim et al. ............... 365/189.14 |

FOREIGN PATENT DOCUMENTS

| | | |
|---|---|---|
| WO | WO-2013188387 A2 | 12/2013 |
| WO | WO-2013188387 A3 | 12/2013 |

OTHER PUBLICATIONS

Chen, Yin-Jen, et al., "Source/drain DOPANT concentration induced reliability issues in charge trapping NAND flash cells", 2010 IEEE International Reliability Physics Symposium (IRPS), (2010), 634-638.

Han, Jin-Woo, et al., "Gate-Induced Drain-Leakage (GIDL) Programming Method for Soft-Programming-Free Operation in Unified RAM (URAM)", IEEE Electron Device Letter, vol. 30, No. 2, (Feb. 2009), 189-191.

Han, Jin-Woo, et al., "Polysilicon Channel TFT With Separated Double-Gate for Unified RAM (URAM)—Unified Function for Nonvolatile SONOS Flash and His-Speed Capacitorless 1T-DRAM", IEEE Transactions on Electron Devices, vol. 57. No. 3, (Mar. 2010), 601-607.

Ohsawa, T, et al., "Memory design using a one-transistor gain cell on SOI", IEEE Journal of Solid-State Circuits, 37(11), (Nov. 2002), 1510-1522.

Sakui, Koji, et al., "A Compact Space and Efficient Drain Current Design for Multipillar Vertical MOSFETs", IEEE Transactions on Electron Devices 57(8), (Aug. 2010), 1768-1773.

Shino, Tomoaki, et al., "Floating Body RAM Technology and its Scalability to 32nm Node and Beyond", IEDM '06. International Topic(s): Components, Circuits, Devices & Systems ; Engineered Materials, Dielectrics & Plasmas ; Photonics & Electro-Optic Electron Devices Meeting, 2006., (Dec. 2006), 1-4.

Yoshida, Eiji, et al., "A Capacitorless 1T-DRAM Technology Using Gate-Induced Drain-Leakage (GIDL) Current for Low-Power and High-Speed Embedded Memory", IEEE Transactions on Electron Devices, vol. 53, No. 4, (Apr. 2006), 692-697.

"International Application Serial No. PCT/US2013/045160, International Preliminary Report on Patentability mailed Dec. 24, 2014", 13 pgs.

"International Application Serial No. PCT/US2013/045160, International Search Report mailed Feb. 21, 2014", 3 pgs.

"International Application Serial No. PCT/US2013/045160, Written Opinion mailed Feb. 21, 2014", 11 pgs.

* cited by examiner

APPARATUSES AND METHODS TO MODIFY PILLAR POTENTIAL

BACKGROUND

Semiconductor memory components are used in many electronic devices such as personal digital assistants (PDAs), laptop computers, mobile phones and digital cameras. Some of these semiconductor memory components have arrays of charge storage devices.

BRIEF DESCRIPTION OF THE DRAWINGS

Some embodiments are illustrated by way of example and not limitation in the figures of the accompanying drawings in which.

DETAILED DESCRIPTION

An array of charge storage devices according to various embodiments of the invention may function as an array of memory cells in a memory device such as a NOT AND (NAND) memory device.

For the purposes of this document, an "apparatus" can refer to any of a number of structures, such as circuitry, a device or a system. In this document, a charge storage device or a transistor is described as being switched "on" to assume an activated state when it is rendered conductive by a control gate voltage that is separated from its source voltage by at least its threshold voltage. The charge storage device or the transistor is described as being switched "off" to assume an inactive state when the difference between the control gate voltage and the source voltage is less than the threshold voltage, so that the charge storage device or the transistor is rendered non-conductive. A "potential" is always an electrical potential. Multiple charge storage devices can be read at the same time during a page read operation where a "page" includes a fixed amount of data within a single device, such as two kilobytes of data within a memory chip.

Figures 1, 2:
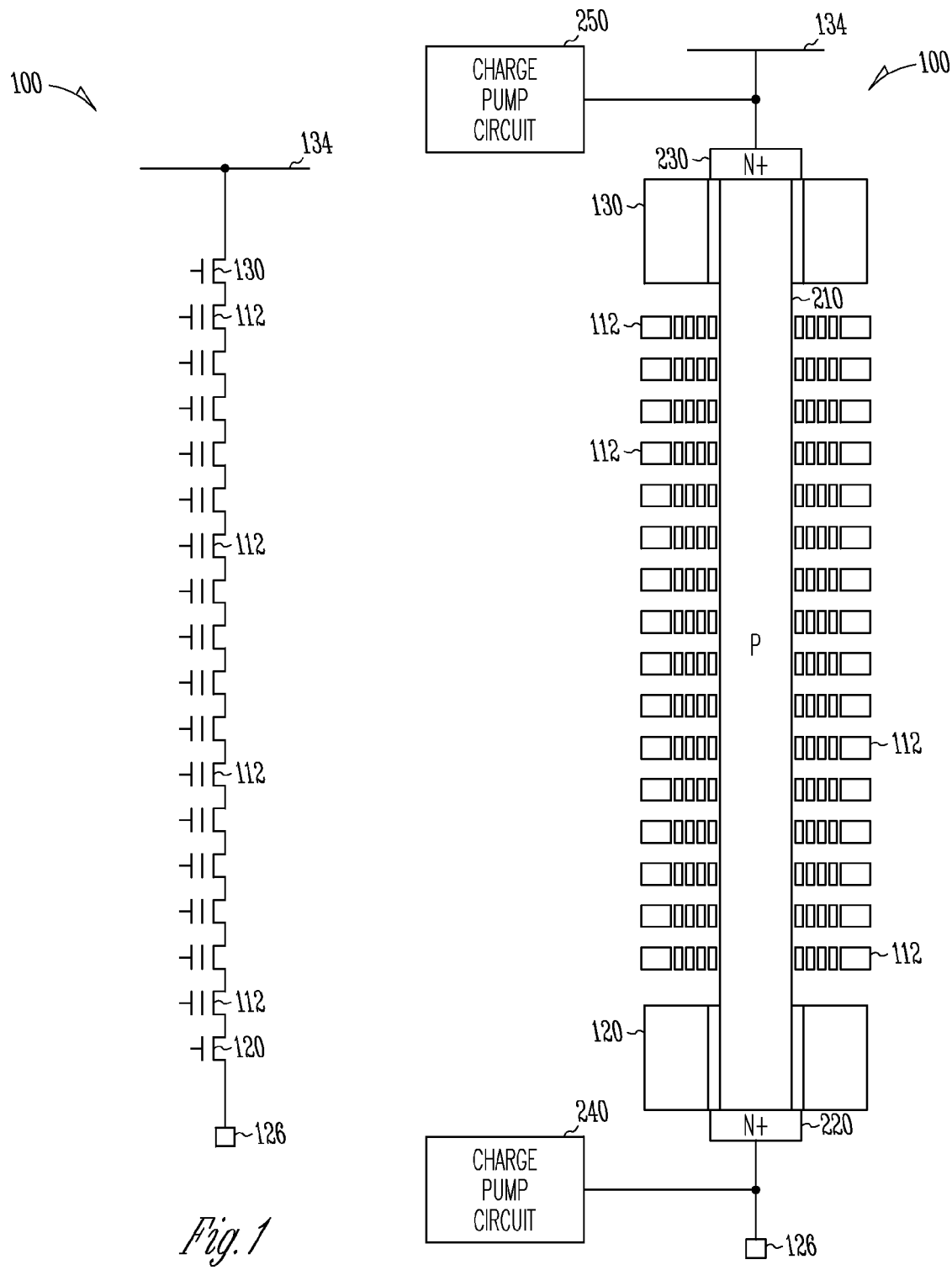
FIG. 1 is an electrical schematic diagram of an apparatus in the form of a string of charge storage devices according to various embodiments of the invention.
FIG. 2 is a cross-sectional view of a semiconductor construction of the string shown in FIG. 1 according to various embodiments of the invention.

FIG. 1 is an electrical schematic diagram of an apparatus in the form of a string 100 of charge storage devices according to various embodiments of the invention. The string 100 includes 16 charge storage devices 112, and can include more or less than 16 charge storage devices 112. The string 100 includes a source select gate (SGS) transistor 120 which is typically an n-channel transistor coupled between one of the charge storage devices 112 at one end of the string 100 and a common source 126. The common source 126 may comprise, for example, a slot of commonly doped semiconductor material and/or other conductive material. At the other end of the string 100, a drain select gate (SGD) transistor 130 is typically an n-channel transistor coupled between one of the charge storage devices 112 and a data line 134. The common source 126 can be coupled to a reference voltage (e.g., ground voltage) or a voltage source (e.g., a charge pump circuit). Two elements coupled together are in electrical contact with each other or are separated by one or more conductors or semiconductors that enable conduction between the elements. Two elements in electrical contact with each other are in physical contact at a junction (e.g., a p-n junction) that enables a flow of electrons or holes across the junction.

Each charge storage device 112 may comprise, for example, a floating gate transistor or a charge trap transistor and may be a single level charge storage device or a multilevel charge storage device. The charge storage devices 112, the SGS transistor 120, and the SGD transistor 130 are controlled by signals on their respective control gates, the signals being provided on access lines (not shown). In some cases, the control gates can at least partially form the access lines. The SGD transistor 130 receives a signal that controls the SGD transistor 130, so that the SGD transistor 130 can be used to select or deselect the string 100. The string 100 can be one of multiple strings of charge storage devices in a block in a NAND memory device.

FIG. 2 is a cross-sectional view of a semiconductor construction of the string 100 shown in FIG. 1 according to various embodiments of the invention. The charge storage devices 112, the SGS transistor 120 and the SGD transistor 130 at least partially surround (e.g., surround or partially surround) a pillar 210 of semiconductor material. The pillar 210 can comprise p type polysilicon and is a channel for the charge storage devices 112, the SGS transistor 120 and the SGD transistor 130. The charge storage devices 112, the SGS transistor 120 and the SGD transistor 130 are associated with the pillar 210. The pillar 210 extends between a source cap 220 comprising n+ type polysilicon and a drain cap 230 comprising n+ type polysilicon. The source cap 220 is in electrical contact with the pillar 210 and forms a p-n junction with the pillar 210. The drain cap 230 is in electrical contact with the pillar 210 and forms a p-n junction with the pillar 210. The source cap 220 is a source for the pillar 210 and the drain cap 230 is a drain for the pillar 210. The source cap 220 is coupled to the common source 126 and to a charge pump circuit 240. The drain cap 230 is coupled to the data line 134 and may be coupled to a charge pump circuit 250. A first p-n junction exists between the pillar 210 and the source cap 220, and a second p-n junction exists between the pillar 210 and the drain cap 230.

Figure 3:
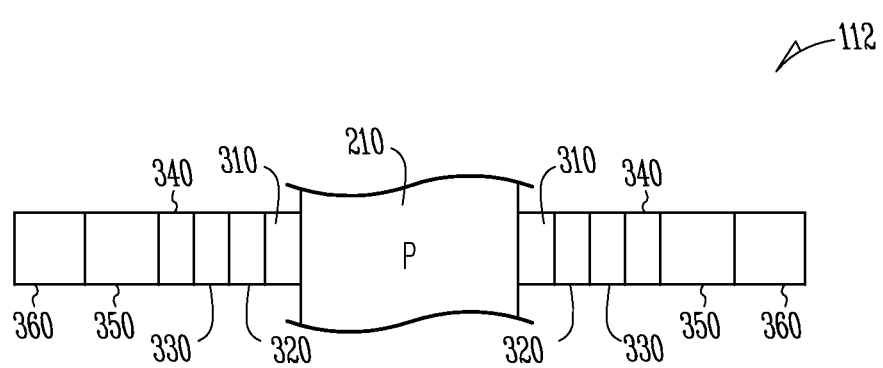
FIG. 3 is a cross-sectional view of a semiconductor construction of a charge storage device of the string shown in FIG. 1 and FIG. 2 according to various embodiments of the invention.

FIG. 3 is a cross-sectional view of a semiconductor construction of a charge storage device 112 of the string 100 shown in FIG. 1 and FIG. 2 according to various embodiments of the invention. The charge storage device 112 surrounds or partially surrounds the pillar 210. The pillar 210 can comprise p type polysilicon. The pillar 210 may be surrounded or partially surrounded by a first dielectric 310 comprising silicon dioxide ($SiO_2$). The first dielectric 310 may be surrounded or partially surrounded by a floating gate 320 comprising polysilicon. The floating gate 320 may be surrounded or partially surrounded by a second dielectric 330 comprising silicon dioxide ($SiO_2$) and silicon nitride ($Si_3N_4$) and a third dielectric 340 comprising silicon dioxide ($SiO_2$) such that the second dielectric 330 and the third dielectric 340 comprise an inter-poly dielectric (IPD) layer of oxide-nitride-oxide ($SiO_2Si_3N_4SiO_2$ or "ONO"). The third dielectric 340 may be surrounded or partially surrounded by a control gate 350 comprising polysilicon. The control gate 350 may be surrounded or partially surrounded by a metal silicide 360. The metal silicide 360 may comprise, for example, one or more of cobalt silicide (CoSi), titanium silicide (TiSi), tungsten silicide (WSi), nickel silicide (NiSi), tantalum silicide (TaSi), molybdenum silicide (MoSi) or platinum silicide (PtSi).

Figure 4:
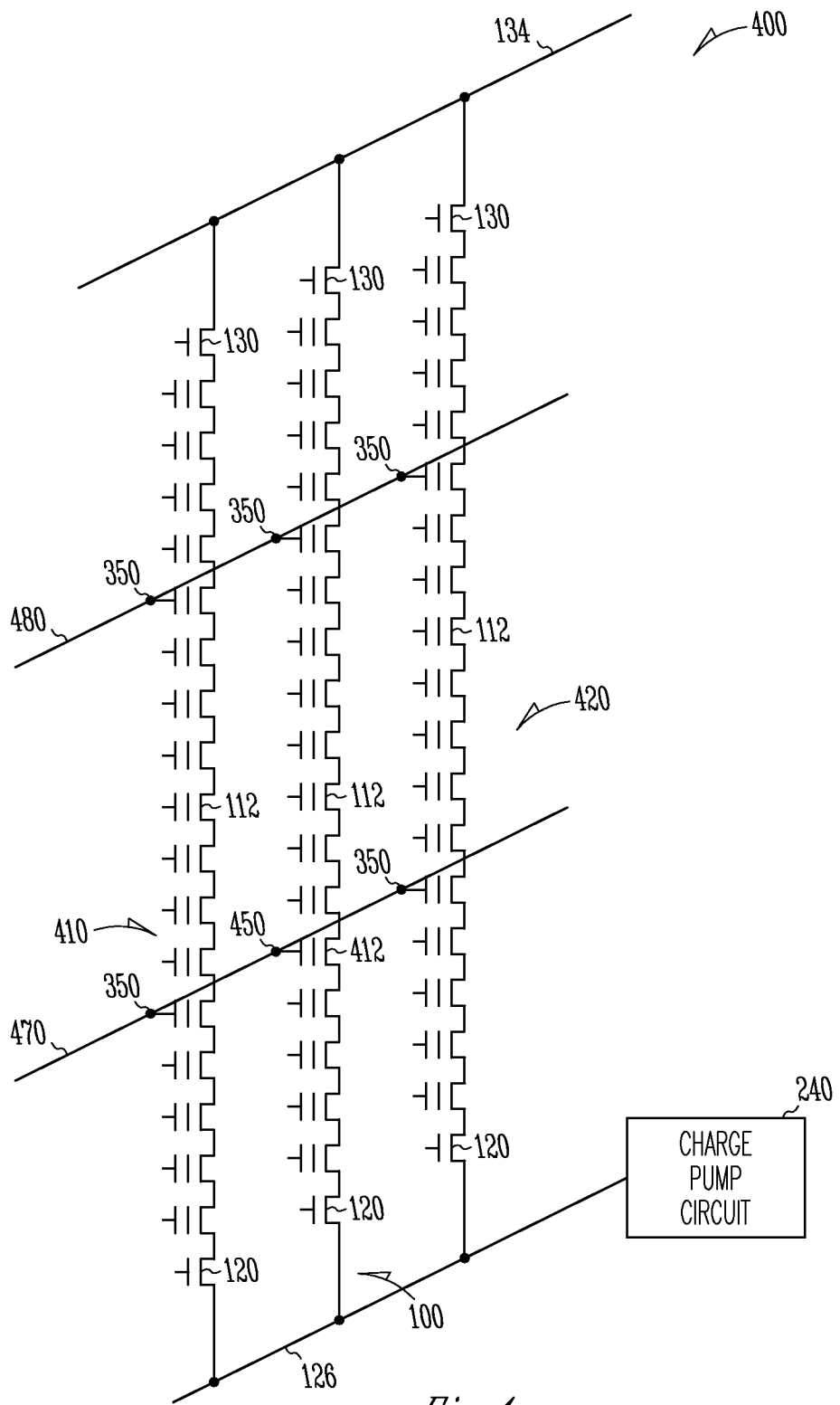
FIG. 4 is an electrical schematic diagram of an apparatus in the form of a block of strings of charge storage devices according to various embodiments of the invention.

FIG. 4 is an electrical schematic diagram of an apparatus in the form of a block 400 of strings 100, 410 and 420 of charge storage devices 112 according to various embodiments of the invention. The string 100 includes a selected charge storage device 412 with a selected control gate 450. The string 100 is shown in FIG. 1, and the strings 410 and 420 each have the same structure as the string 100 according to various embodiments of the invention. A bottom end of the string 100 is coupled to the common source 126 and bottom ends of the strings 410 and 420 are also coupled to the common source 126 and the charge pump circuit 240. Top ends of the strings 100, 410 and 420 are coupled to the data line 134. The string 410 is adjacent to the string 100 and the string 420 is also adjacent to the string 100. The data line 134 is coupled to other strings of charge storage devices (not shown). The block 400 of strings 100, 410 and 420 can include more strings and can be located in an array with other blocks of strings of charge storage devices (not shown).

The control gates 350 of the charge storage devices 112 in the block 400 share, and in some cases at least partially form, access lines. Each access line is coupled to a control gate 350 of a charge storage device 112 in each of the strings 100, 410 and 420 in the block 400. The charge storage devices 112 coupled to the same access line also occupy the same position with respect to the other charge storage devices 112 in the respective string 100, 410 and 420. For example, a first access line 470 is coupled to the control gates 350 and 450 of corresponding ones of the charge storage devices 112 and 412 occupying the same location in each of the strings 100, 410 and 420. A second access line 480 is coupled to the control gates 350 of corresponding ones of the charge storage devices 112 occupying the same location in each of the strings 100, 410 and 420. Other access lines are not shown for purposes of clarity. During a read operation, an erase operation or a write operation on a charge storage device 112 or 412 in the block 400, the charge storage devices 112 and 412 coupled to the same access line receive the same signal on that access line.

The potentials of access lines such as the access lines 470 and 480 are raised during a read operation of a charge storage device 112 or 412 in the block 400, yet only one of the strings 100, 410 and 420 with the charge storage device 112 or 412 being read is selected. The SGS transistors 120 and the SGD transistors 130 of the deselected strings are switched off such that the pillars 210 of the deselected strings are left floating. For example, if the charge storage device 112 or 412 being read is located in the string 100, the SGS transistor 120 and the SGD transistor 130 of the string 100 are switched on. The SGS transistors 120 and the SGD transistors 130 of the deselected strings 410 and 420 are switched off such that the pillars 210 of the deselected strings 410 and 420 are left floating during the read operation. The potentials of the pillars 210 of the deselected strings 410 and 420 are raised during the read operation from capacitive coupling with the control gates 350, and the pillars 210 of the deselected strings 410 and 420 can reach a negative potential below the reference voltage (e.g., ground voltage) at the end of the read operation when the potentials of the access lines such as the access lines 470 and 480 and the control gates 350 are lowered (e.g., reduced).

The negative potentials of the pillars 210 can adversely influence a subsequent operation on the block 400. The inventors have discovered that this operational challenge, as well as others, can be addressed by, for example, raising a potential of the common source 126 (and thus the source caps 220) for a period of time to induce gate-induced drain leakage (GIDL) current in the SGS transistors 120 of the deselected strings 410 and 420 to raise the potentials of the pillars 210 of the deselected strings in the block 400 to a level suitable for a subsequent operation.

GIDL current can be induced in a channel of a transistor when the potential of the source or drain region (source/drain) is higher that the potential of the gate, creating electron-hole pairs. The electrons migrate to the source/drain leaving excess holes in a floating body of the transistor. With reference to FIG. 2, GIDL current can be induced in the SGS transistors 120 and/or the SGD transistors 130. The excess holes from the GIDL current raise the potential of the floating pillars 210.

Figure 5:
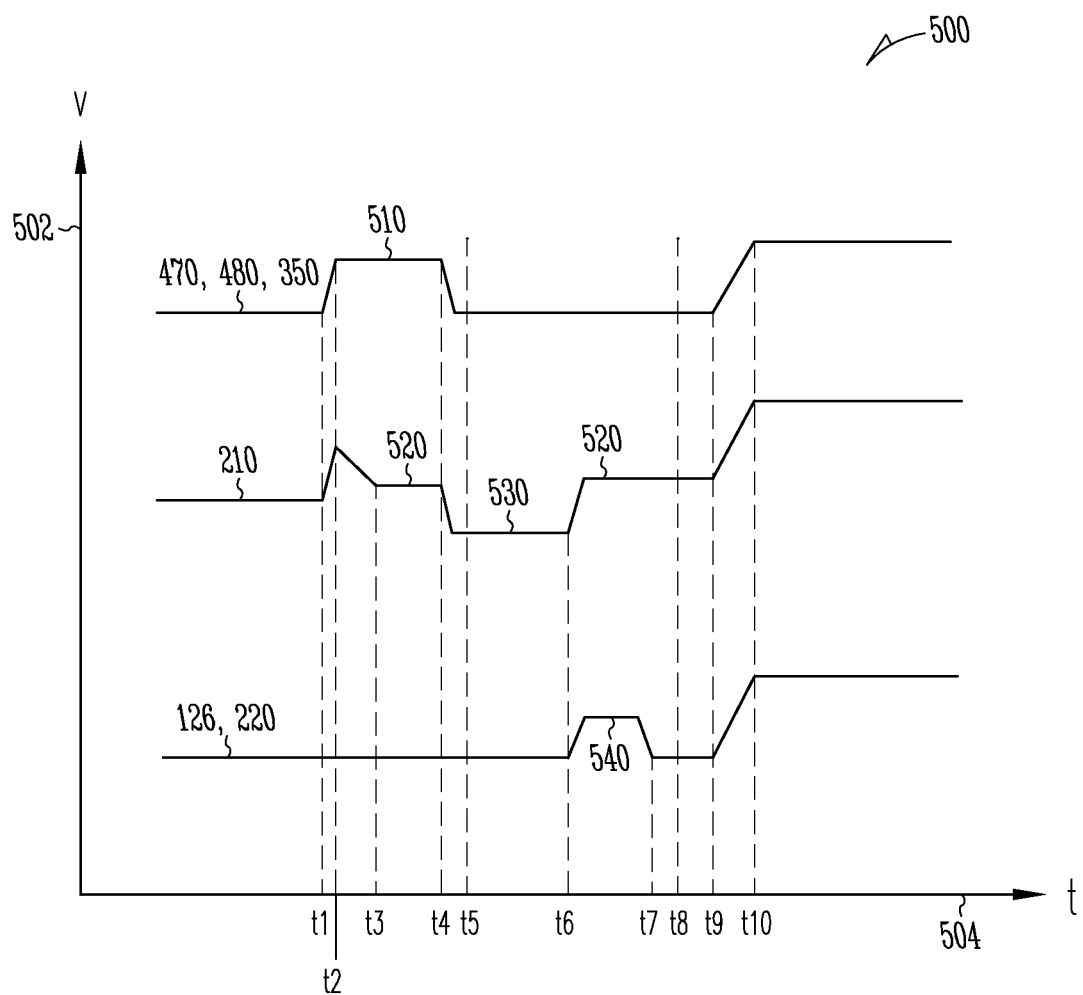
FIG. 5 is a timing diagram for the block of FIG. 4 during a read operation followed by an erase operation according to various embodiments of the invention.

FIG. 5 is a timing diagram 500 for the block 400 of FIG. 4 during a read operation followed by an erase operation according to various embodiments of the invention. At the top of the timing diagram 500, the potential on the access lines 470 and 480 is shown. The applied potential for control gates 350 of charge storage devices 112 in deselected strings, such as the strings 410 and 420, is also shown. The potential of the access lines 470 and 480 represents all but one of the access lines in the block 400.

The potentials of the pillars 210 of the deselected strings 410 and 420 are illustrated in the middle of the timing diagram 500. The potentials of the source caps 220 of the strings 100, 410 and 420 and the common source 126 are illustrated at the bottom of the timing diagram 500. Voltage V on each of the lines and other structures is represented on a vertical axis 502, and time t is represented on a horizontal axis 504.

The access lines 470 and 480, the control gates 350, the pillars 210 of the deselected strings 410 and 420, the source caps 220 and the common source 126 can all be at a reference voltage (e.g., ground voltage) as the read operation begins prior to time t1. The potential on the access lines 470 and 480 and the control gates 350 can rise at time t1 and to reach a value of Vpass_read 510 at time t2. The potential of the pillars 210 of the deselected strings 410 and 420 begins to rise at time t1 due to capacitive coupling with the control gates 350.

The potential of the pillars 210 of the deselected strings 410 and 420 stops rising and begins to fall at time t2 when, in each of the pillars 210, the p-n junction between the pillar 210 and the source cap 220 and/or the p-n junction between the pillar 210 and the drain cap 230 become forward-biased to draw charge from each pillar 210. The potential of each pillar 210 of the deselected strings 410 and 420 falls to a value of Vin 520 at time t3, Vin being the voltage drop across the forward-biased p-n junction.

A charge storage device 112 or 412 in a selected string, such as the string 100, can be read while the access lines 470 and 480 and the control gates 350 are at the read pass potential Vpass_read 510 following time t2. The potential of the access lines 470 and 480 and the control gates 350 can begin to fall at time t4 to reach the reference voltage by time t5, marking the end of the read operation. Capacitive coupling between the control gates 350 and the pillars 210 of the deselected strings 410 and 420 causes the potential of the pillars 210 to fall from Vin 520 to a negative potential 530 that is below the reference voltage. The negative potential 530 of the pillars 210 of the deselected strings 410 and 420 can cause irregularities in operations that follow the read operation, and also worsen the data retention because of the electric field generated by the negative potential.

The charge pump circuit 240 can be used to raise the potential of the common source 126 and the source caps 220 of the strings 100, 410 and 420 at time t6 to a raised voltage 540 that is above Vin. The raised voltage 540 on the common source 126 can induce GIDL current in the SGS transistors 120, and the resulting excess quantity of holes operate to raise the potential of the pillars 210 to Vin 520 after time t6. The potential of the common source 126 and the source caps 220 of the strings 100, 410 and 420 can be lowered to the reference voltage at time t7, after the pillars 210 have reached Vin 520.

An erase operation can begin at time t8 with the pillars 210 of the deselected strings 410 and 420 at a potential value Vin 520. The access lines 470 and 480, the control gates 350, the common source 126 and the source caps 220 of the deselected strings 410 and 420 can be at the reference voltage at time t8. All of the potentials shown in the timing diagram 500 can be raised beginning at time t9 so as to reach erase potentials at time t10, to commence an erase operation.

During a read operation in the block 400 of FIG. 4, holes can be generated in the pillars 210 of the selected strings such as the selected string 100 by the charge storage devices 112, the SGS transistors 120 and the SGD transistors 130. Successive reads involving the same pillar 210 can raise the potential of the pillar 210 such that threshold voltages of the charge storage devices 112 can be modified, due to the presence of excess charge. The inventors have discovered that this operational challenge, as well as others, can be addressed by lowering the potential of the common source 126 for a period of time, to forward-bias the p-n junction between the source cap 220 and a pillar 210 of the block 400, which enables conduction, to lower the potential of such pillars 210 in the block 400 to a level suitable for a subsequent operation such as a read operation.

Figure 6:
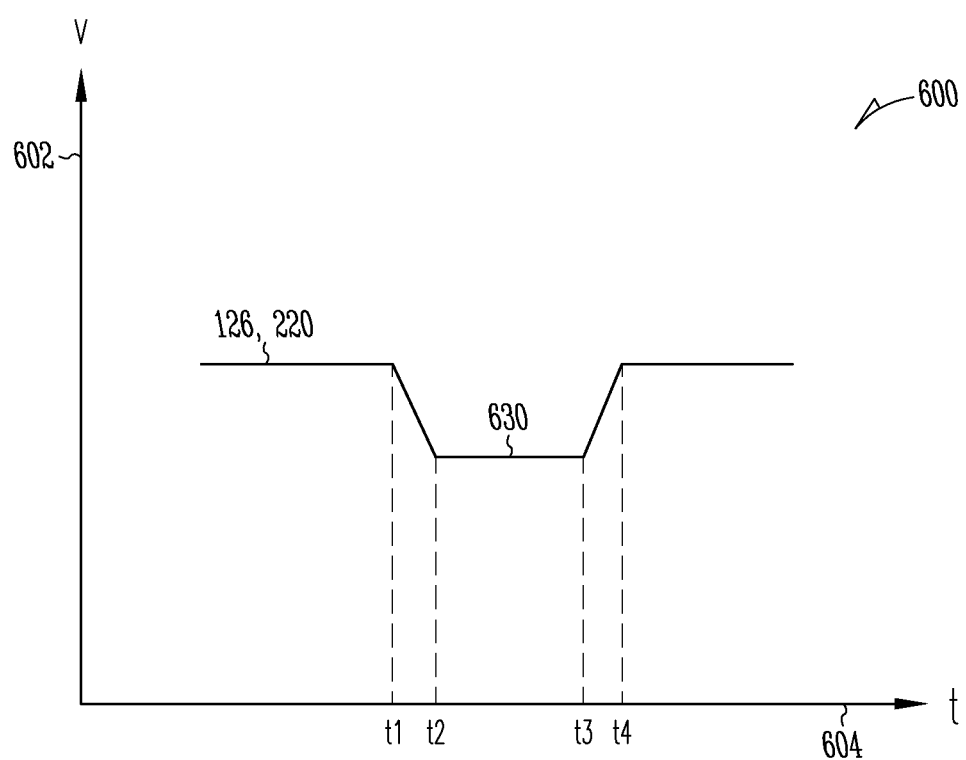
FIG. 6 is a timing diagram for the block of FIG. 4, illustrating the activity between read operations according to various embodiments of the invention.

FIG. 6 is a timing diagram 600 for the block 400 of FIG. 4, illustrating the activity between read operations according to various embodiments of the invention. The timing diagram 600 illustrates the values of the potentials of the source caps 220 of the strings 100, 410 and 420 and the common source 126. The potential of the common source 126 can be coupled to all of the strings in the block 400, including strings not shown in FIGS. 1-4. Voltage V on the lines and other structures is represented on a vertical axis 602, and time t is represented on a horizontal axis 604.

The source caps 220 and the common source 126 can all be at a reference voltage (e.g., ground voltage) up to time t1 as a read operation ends and the pillars 210 of strings that have been involved in one or more read operations have excess positive charge. The charge pump circuit 240 can then lower the potential of the common source 126 and the source caps 220 between time t1 and time t2. The potential of the common source 126 and the source caps 220 can be lowered from the reference voltage to a negative bias voltage 630 between times t1 and t2.

The common source 126 and the source caps 220 remain at the negative bias voltage 630 between time t2 and time t3. The p-n junctions between the source caps 220 and the respective pillars 210 are forward biased between the times t2 and t3 so that holes in the pillars 210 are absorbed by the source caps 220 to lower the potential of the pillars 210. The negative bias voltage 630 can be, for example, about −0.8 volts. The charge pump circuit 240 can then raise the potential of the common source 126 and the source caps 220 to a reference voltage between time t3 and time t4. The potential of the pillars 210 is modified between times t2 and t3 so that a subsequent operation such as a read operation can be performed on one of the charge storage devices 112 associated with the pillars 210 when the pillars 210 are at an appropriate potential.

The potential of the common source 126 and the source caps 220 can be lowered after one or more of the charge storage devices 112 and 412 in the block 400 have been read a selected number of times, when the potentials of the pillars 210 may have reached an undesirable level, rather than being lowered after every read operation. The potential of the pillars 210 may also be modified by lowering the potential of the data line 134 and the drain caps 230 with the charge pump circuit 250 to forward-bias the p-n junctions between the pillars 210 and the respective drain caps 230 according to various embodiments of the invention.

As discussed above with respect to FIG. 5, the pillars 210 of the deselected strings 410 and 420 can reach a negative potential below a reference voltage (e.g., ground voltage) at the end of a read operation when the potentials of the control gates 350 are lowered. The negative potentials of the pillars 210 can adversely influence a subsequent operation, such as a sequential page read on the block 400, and also worsen the data retention because of the electric field generated by the negative potential. The inventors have discovered that this operational challenge, as well as others, can be addressed by raising the potential of the common source 126 and the source caps 220 for a period of time to induce GIDL current in the SGS transistors 120 to raise the potentials of the pillars 210 in the block 400 to a potential suitable for a subsequent operation such as a sequential read operation.

Figure 7:
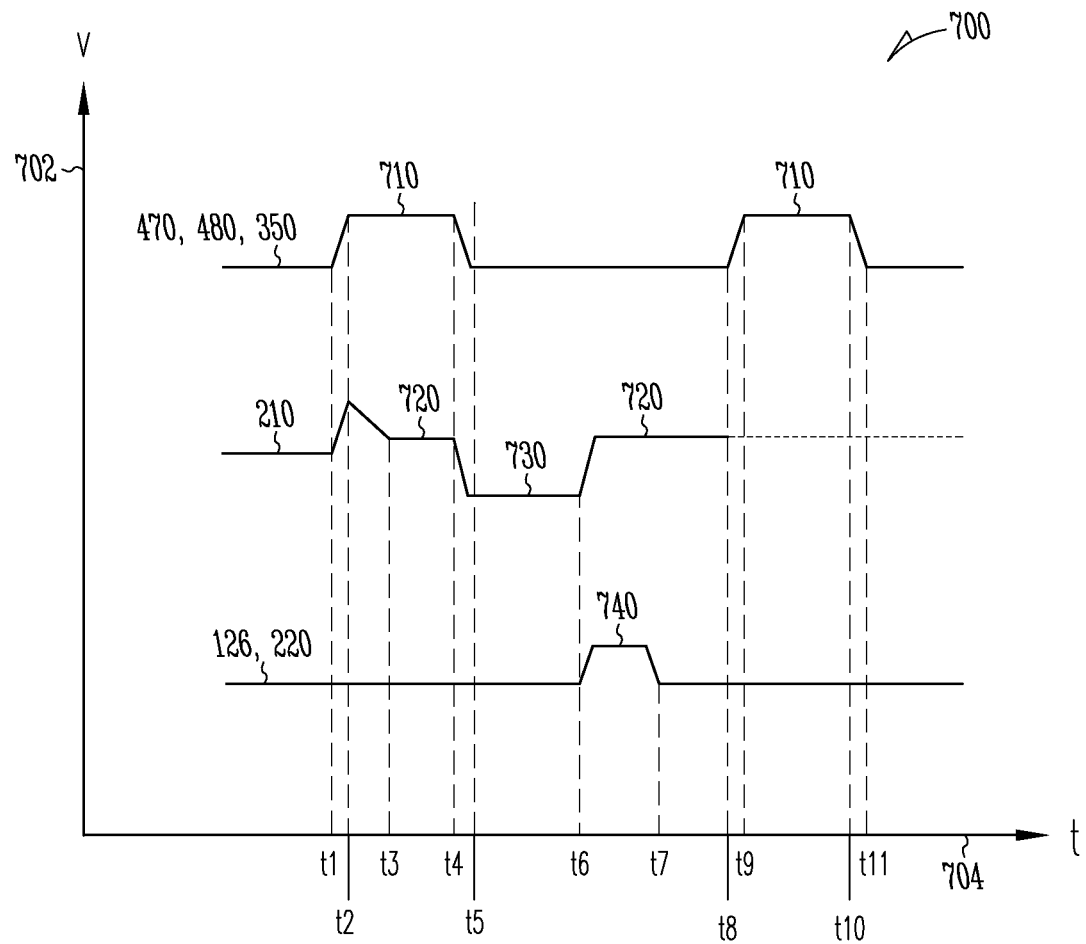
FIG. 7 is a timing diagram for the block of FIG. 4 during a first read operation followed by a second read operation according to various embodiments of the invention.

FIG. 7 is a timing diagram 700 for the block 400 of FIG. 4 during a first read operation followed by a second read operation according to various embodiments of the invention. The timing diagram 700 illustrates the potential of the access lines 470 and 480 and the control gates 350 and 450 of charge storage devices 112 and 412 in the strings 100, 410 and 420. The potential of the access lines 470 and 480 represents all but one of the access lines in the block 400. The potentials of the pillars 210 of the deselected strings such as the strings 410 and 420 are illustrated in the middle of the timing diagram 700. The potentials of the source caps 220 of the strings 100, 410 and 420 and the common source 126 are illustrated at the bottom of the timing diagram 700. Voltage V on the lines and other structures is represented on a vertical axis 702, and time t is represented on a horizontal axis 704.

The access lines 470 and 480, the control gates 350 and 450, the pillars 210 of the deselected strings 410 and 420, the source caps 220 and the common source 126 can all be at a reference voltage (e.g., ground voltage) as the first read operation begins prior to time t1. The access lines 470 and 480 and the control gates 350 and 450 can begin to rise at time t1 and reach a read potential Vpass_read 710 at time t2. The potential of the pillars 210 of the deselected strings 410 and 420 begin to rise at time t1 due to capacitive coupling with the control gates 350 and 450.

The potential of the pillars 210 of the deselected strings 410 and 420 stops rising and begins to fall at time t2 when, in each of the pillars 210 of the deselected strings 410 and 420, the p-n junction between the pillar 210 and the source cap 220 and/or the p-n junction between the pillar 210 and the drain cap 230 become forward-biased to draw charge from each pillar 210. The potential of each pillar 210 falls to Vin 720 at time t3, Vin being a voltage drop across the forward-biased p-n junctions.

A charge storage device 112 or 412 in the block 400 can be read while the access lines 470 and 480 and the control gates 350 and 450 are at the read potential Vpass_read 710 following time t2. The potential of the access lines 470 and 480 and the control gates 350 and 450 can begin to fall at time t4 and reach the reference voltage by time t5, marking the end of the read operation. Capacitive coupling between the control gates 350 and 450 and the pillars 210 causes the potential of the pillars 210 of the deselected strings 410 and 420 to fall from Vin 720 to a negative potential 730 that is below the reference voltage. The negative potential 730 of the pillars 210 of the deselected strings 410 and 420 can cause irregularities in operations following the read operation, such as a second read operation on the block 400.

The charge pump circuit 240 can raise the potential of the common source 126 and the source caps 220 of the strings 100, 410 and 420 at time t6 to a raised voltage 740 above Vin. The raised voltage 740 on the common source 126 induces GIDL current in the SGS transistors 120 of the deselected strings 410 and 420, and the resulting presence of excess holes can operate to raise the potential of the pillars 210 of the deselected strings 410 and 420 to Vin 720 after time t6. The potential of the common source 126 and the source caps 220 of the strings 100, 410 and 420 can be lowered to the reference voltage at time t7 after the pillars 210 of the deselected strings 410 and 420 have reached Vin 720.

The second read operation can begin at time t8 with the pillars 210 of the deselected strings 410 and 420 at a potential value of Vin 720. The access lines 470 and 480, the control gates 350 and 450, the common source 126 and the source caps 220 of the deselected strings 410 and 420 are at the reference voltage at time t8.

The access lines 470 and 480 and the control gates 350 and 450 can begin to rise at time t8 and reach the read potential Vpass_read 710 at time t9. A charge storage device 112 or 412 in the block 400 can be read while the access lines 470 and 480 and the control gates 350 are at the read potential Vpass_read 710 following time t9. The potential of the access lines 470 and 480 and the control gates 350 can begin to fall at time t10 and reach the reference voltage by time t11, marking the end of the second read operation of the selected string 410.

The potentials of the pillars 210 can be modified after a program operation. The potentials of access lines are raised during a program operation and a program verify operation of the selected charge storage device 412 in the block 400, yet only one of the strings 100 with the selected charge storage device 412 being programmed is selected. During a program verify operation, the SGS transistor 120 and the SGD transistor 130 of the selected string 100 are switched on. The SGS transistors 120 and the SGD transistors 130 of the deselected strings 410 and 420 are switched off, such that the pillars 210 of the deselected strings 410 and 420 are left floating during the program verify operations. During a programming operation, all SGS transistors are switched off. The potentials of the pillars 210 of the deselected strings 410 and 420 are raised during the programming and the program verify operations from capacitive coupling with the control gates 350, and the pillars 210 of the deselected strings 410 and 420 can reach a negative potential below a reference voltage (e.g., ground voltage) at the end of the programming and the program verify operations when the potentials of the control gates 350 are lowered.

The negative potentials on the pillars 210 can adversely influence a succeeding operation on the block 400. The inventors have discovered that this operational challenge, as well as others, can be addressed by raising a potential of the common source 126 for a period of time to induce GIDL current to pass through the source caps 220 of the pillars 210 of the deselected strings 410 and 420 to raise the potentials of the pillars 210 in the block 400 to a level suitable for a new operation.

Figure 8:
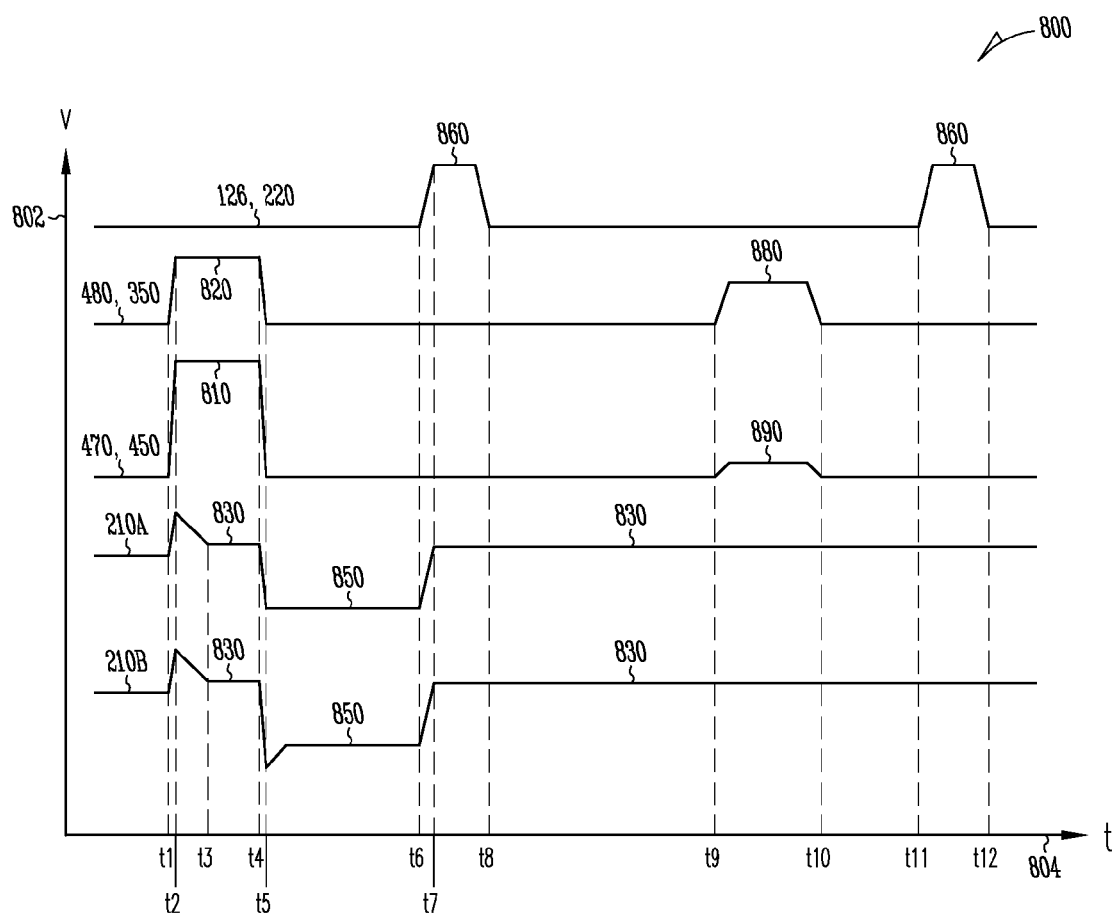
FIG. 8 is a timing diagram for the block of FIG. 4 for a programming operation according to various embodiments of the invention.

FIG. 8 is a timing diagram 800 for the block 400 of FIG. 4 for a programming operation according to various embodiments of the invention. The timing diagram 800 illustrates the potential of the access lines 470 and 480 and the control gates 350 and 450 of charge storage devices 112 in the string 100 which is a selected string in the block 400 having the selected charge storage device 412 to be programmed. The SGS transistor 120 is switched off and the SGD transistor 130 is switched on in the selected string 100. The access line 480 and the associated control gate 350 are unselected. The access line 470 and the associated control gate 450 are selected. The charge storage device 412 associated with the selected access line 470 and the selected control gate 450 is to be programmed by the potentials shown in FIG. 8. Programming of the selected charge storage device 412 is enabled when the data line 134 is at a reference voltage (e.g., a ground voltage), and programming of the selected charge storage device 412 is inhibited when the data line 134 is biased to a raised voltage Vcc.

Potentials 210A and 210B of the pillar 210 of the selected string 100 when enabled for programming (e.g., when the associated data line 134 is at a reference voltage, e.g., a ground voltage), are shown in the bottom portion of the timing diagram 800. The potential of the source cap 220 and the common source 126 (and thus of the source cap 220 of the selected string 100) are illustrated at the top of the timing diagram 800. Voltage V is represented on a vertical axis 802 and time t is represented on a horizontal axis 804.

The potential 210A is the potential of the pillar 210 of the selected string 100 associated with an unselected control gate 350 when the selected string 100 is enabled for programming (e.g., when the associated data line 134 is at a reference voltage, e.g., a ground voltage). The potential 210B is the potential of the pillar 210 of the selected string 100 associated with the selected control gate 450 when the selected string 100 is enabled for programming.

The access lines 470 and 480, the control gates 350 and 450, the pillar 210, the source cap 220 and the common source 126 can all be at a reference voltage (e.g., ground voltage) as the programming operation begins prior to time t1. The pillar 210 is floating prior to time t1. The selected access line 470 and the selected control gate 450 can begin to rise at time t1 to reach a program potential 810 at time t2. The unselected access line 480 and the unselected control gate 350 can begin to rise at time t1 and reach a non-program potential 820 at time t2. The potential of the pillar 210 can begin to rise at time t1 due to capacitive coupling with the control gates 350 and 450. The potentials 210A and 210B of the pillar 210 stop rising and begin to fall at time t2 when the p-n junction between the pillar 210 and the source cap 220 and/or the p-n junction between the pillar 210 and the drain cap 230 become forward-biased to draw charge from the pillar 210.

If the selected string 100 is enabled for programming, the potentials 210A and 210B of the pillar 210 can fall to Vin 830 at time t3, Vin 830 being a voltage drop across the forward-biased p-n junction.

If the selected string 100 is enabled for programming, the selected charge storage device 412 in the block 400 can be programmed while the selected access line 470 and the selected control gate 450 are at the program potential 810 following time t2. The potential of the access lines 470 and 480 and the control gates 350 and 450 can begin to fall at time t4, reaching the reference voltage at time t5, and marking the end of the programming operation. Capacitive coupling between the control gates 350 and 450 and the pillar 210 causes the potentials 210A and 210B of the pillar 210 to begin to fall at time t4. The potential 210A of the pillar 210 of the selected string 100, when enabled for programming, can fall to a negative potential 850. The potential 210B of the pillar 210 of the selected string 100, when enabled for programming, stops falling and begins to rise at time t5 to the negative potential 850.

The negative potential of the pillar 210 of the selected string 100 can cause irregularities in operations that follow the programming operation. The charge pump circuit 240 can be used to raise the potential of the common source 126 and the source cap 220 of the selected string 100 beginning at time t6, to reach the raised voltage 860 at time t7 that is above the reference voltage. The potentials 210A and 210B of the pillar 210 begin to rise at time t6 to reach the potential Vin 830 at time t7. The raised voltage 860 on the common source 126 induces GIDL current in the SGS transistor 120 of the selected string 100, and the resulting presence of excess holes can operate to raise the potential of the pillar 210. The potential of the common source 126 and the source cap 220 of the selected string 100 can be lowered to the reference voltage at time t8 after the pillar 210 has reached the potential Vin 830.

A program verify operation can begin at time t9 with the potentials 210A and 210B of the pillar 210 of the selected string 100 at a value of Vin 830. The potential of the unselected access line 480 and the unselected control gate 350 is raised beginning at time t9, to reach a raised voltage 880, and is then lowered to the reference voltage at time t10. The potential of the selected access line 470 and the selected control gate 450 is raised beginning at time t9 to reach a raised voltage 890, and is then lowered to the reference voltage at time t10 to verify the programming of the selected charge storage device 412. The potentials 210A and 210B of the pillar 210 of the selected string 100 remain at a value of Vin 830 between the times t9 and t10.

The charge pump circuit 240 can raise the potential of the common source 126 and the source cap 220 of the string 100 a second time beginning at time t11 to reach the raised voltage 860 that is above the reference voltage. The potential of the common source 126 and the source cap 220 of the string 100 can be lowered to the reference voltage at time t12. The potentials 210A and 210B of the pillar 210 remain at the potential Vin 830 between the times t11 and t12, and beyond time t12. This second raising of the potential of the common source 126 raises the potentials 210A and 210B of pillars 210 of deselected strings, such as the strings 410 and 420 discussed below.

Figure 9:
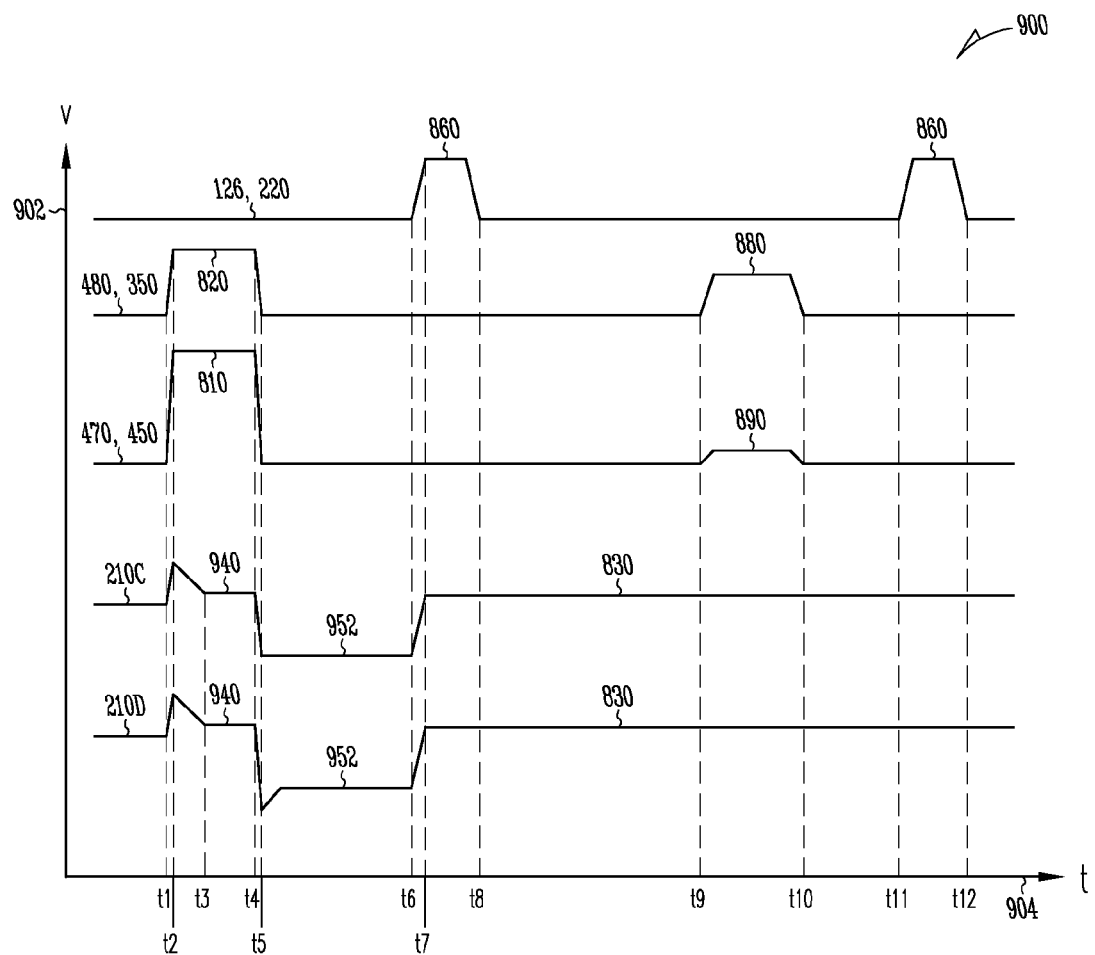
FIG. 9 is a timing diagram for the block of FIG. 4 for a programming operation according to various embodiments of the invention.

FIG. 9 is a timing diagram 900 for the block 400 of FIG. 4 for a programming operation according to various embodiments of the invention. The timing diagram 900 illustrates the potentials of the source cap 220 and the common source 126, the access lines 470 and 480 and the control gates 350 and 450 that are the same as the corresponding potentials of the programming operation shown in FIG. 8, and these potentials will not be further described for purposes of brevity. In the timing diagram 900, the data line 134 is at the raised voltage Vcc and programming is inhibited. Voltage V is represented on a vertical axis 902 and time t is represented on a horizontal axis 904.

Potentials 210C and 210D of the pillar 210 of the selected string 100 are shown in the bottom portion of the timing diagram 900. The potentials 210C and 210D occur when the selected string 100 is inhibited from programming (e.g., when the associated data line 134 is at a raised voltage Vcc provided by a voltage source, e.g., the charge pump circuit 240). The potential 210C is the potential of the pillar 210 associated with the unselected control gate 350. The potential 210D is the potential of the pillar 210 associated with the selected control gate 450. The potentials 210C and 210D can fall to Vin plus the raised voltage Vcc 940 at time t3. The potential 210C can fall to a negative potential 952 by time t5. The negative potential 952 is below the reference voltage of the timing diagram 800. The potential 210D stops falling and begins to rise at time t5 to the negative potential 952. The charge pump circuit 240 can be used to raise the potential of the common source 126 and the source cap 220 of the selected string 100 beginning at time t6, to reach the raised voltage 860 at time t7 that is above the reference voltage. The potentials 210C and 210D of the pillar 210 begin to rise at time t6 to reach the potential Vin 830 at time t7. The potentials 210C and 210D after time t7 are substantially similar to the potentials 210A and 210B shown in FIG. 8 and will not be further described herein for purposes of brevity.

Figure 10:
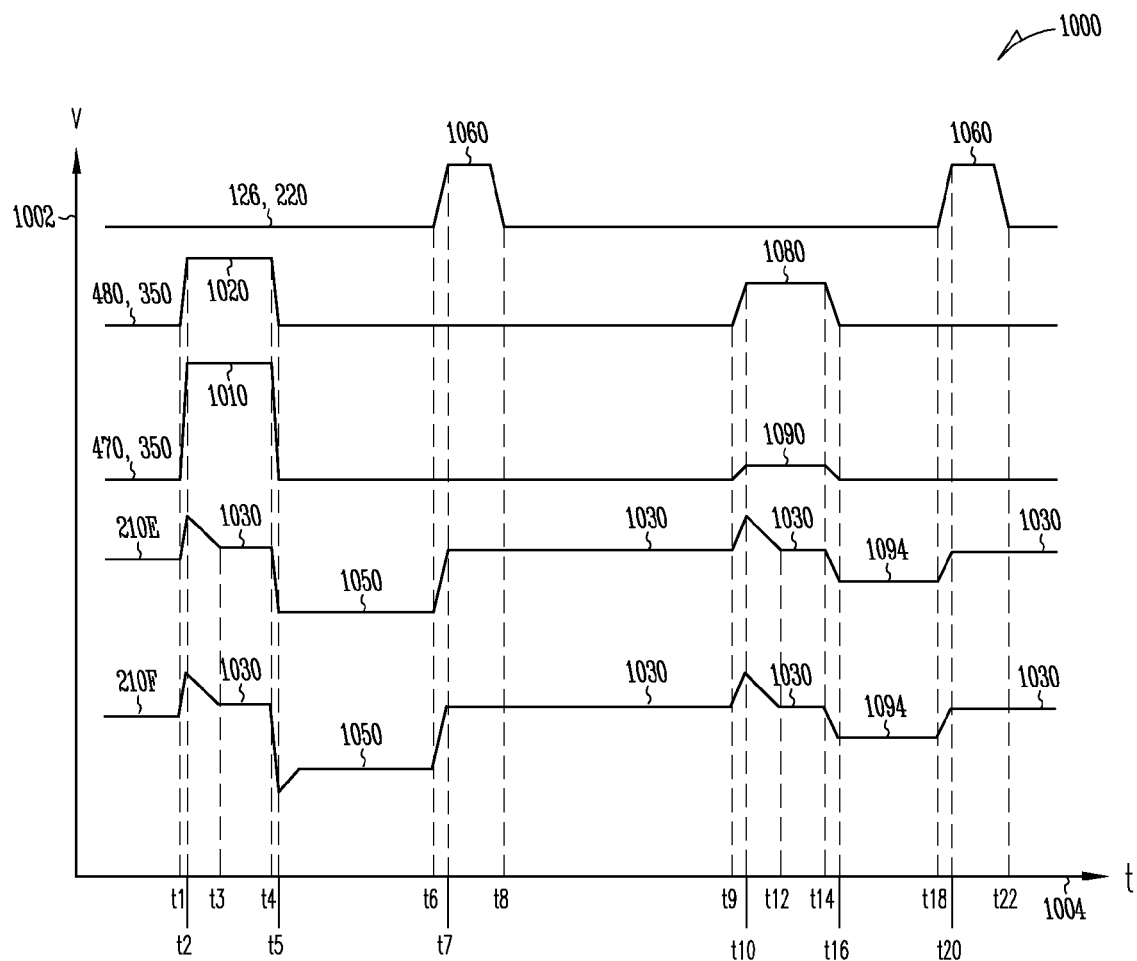
FIG. 10 is a timing diagram for the block of FIG. 4 for a programming operation according to various embodiments of the invention.

FIG. 10 is a timing diagram 1000 for the block 400 of FIG. 4 for a programming operation according to various embodiments of the invention. The timing diagram 1000 illustrates the potential on the access lines 470 and 480 and the control gates 350 of charge storage devices 112 in the strings 410 and 420 which are deselected strings in the block 400 during the programming operation. The selected charge storage device 412 in the string 100 is to be programmed during the programming operation. Potentials 210E and 210F of the pillars 210 of the deselected strings 410 and 420 when enabled for programming (e.g., when the associated data line 134 is at a reference voltage, e.g., a ground voltage), are shown in the bottom portion of the timing diagram 1000. The potentials of the source caps 220 of the strings 410 and 420 and the common source 126 are illustrated at the top of the timing diagram 1000. Voltage V on the lines and other structures is represented on a vertical axis 1002, and time t is represented on a horizontal axis 1004.

The potential 210E is the potential of the pillars 210 of the deselected strings 410 and 420 associated with the unselected control gates 350 when the associated data line 134 is at a reference voltage (e.g., ground voltage). The potential 210F is the potential of the pillars 210 of the deselected strings 410 and 420 associated with the selected control gate 350 when the associated data line 134 is at the reference voltage. The selected control gates 350 are coupled to the same access line 470 as the control gate 450 selected in the selected string 100, although none of the charge storage devices 112 in the deselected strings 410 and 420 are programmed during the programming operation.

The access lines 470 and 480, the control gates 350, the pillars 210, the source caps 220 and the common source 126 can all be at the reference voltage (e.g., ground voltage) as the programming operation begins prior to time t1. The pillars 210 of the deselected strings 410 and 420 are floating during the programming operation. The selected access line 470 and the selected control gates 350 can begin to rise at time t1 to reach a program potential 1010 at time t2. The unselected access line 480 and the unselected control gates 350 can begin to rise at time t1 to reach a non-program potential 1020 at time t2. The potentials 210E and 210F of the pillars 210 can begin to rise at time t1 due to capacitive coupling with the control gates 350. The potentials 210E and 210F of the pillars 210 stop rising and begin to fall at time t2 when the p-n junctions between the pillars 210 and the respective source caps 220 and/or the p-n junctions between the pillars 210 and the respective drain caps 230 become forward-biased to draw charge from the pillars 210.

The potentials 210E and 210F of the pillars 210 can fall to Vin 1030 at time t3, Vin 1030 being a voltage drop across the forward-biased p-n junction. The selected charge storage device 412 in the selected string 100 can be programmed while the selected access line 470 and the selected control gates 350 are at the program potential 1010 following time t2. The potential of the access lines 470 and 480 and the control gates 350 can begin to fall at time t4 to reach the reference voltage at time t5, marking the end of the programming operation. Capacitive coupling between the control gates 350 and the pillars 210 causes the potentials of the pillars 210 to begin to fall at time t4. The potential 210E of the pillars 210 can fall to a negative potential 1050, below the reference voltage, by time t5. The potential 210F of the pillars 210 stops falling and begins to rise to the negative potential 1050 at time t5.

The negative potential 1050 of the pillars 210 can cause irregularities in operations that follow the programming operation. The charge pump circuit 240 can be used to raise the potential of the common source 126 and the source caps 220 of the strings 410 and 420, beginning at time t6, to reach the raised voltage 1060 that is above the reference voltage at time t7. The potentials 210E and 210F of the pillars 210 begin to rise at time t6, to reach the potential level Vin 1030 at time t7. The raised voltage 1060 on the common source 126 induces GIDL current in the SGS transistors 120, and the resulting presence of excess holes can operate to raise the potentials of the pillars 210. The potential of the common source 126 and the source caps 220 of the strings 410 and 420 can be lowered to the reference voltage at time t8 after the pillars 210 have reached the potential Vin 1030.

A program verify operation can begin at time t9 with the potentials 210E and 210F of the pillars 210 of the deselected strings 410 and 420 at a level of Vin 1030. The potentials of the unselected access line 480 and the unselected control gates 350 are raised beginning at time t9 to a raised voltage 1080. The potentials of the selected access line 470 and the selected control gates 350 are raised beginning at time t9 to a raised voltage 1090 to verify the programming of the selected charge storage device 412 in the string 100.

The potentials 210E and 210F of the pillars 210 can begin to rise at time t9 due to capacitive coupling with the control gates 350. The potentials 210E and 210F of the pillars 210 stop rising and begin to fall at time t10 when the p-n junctions between the pillars 210 and the respective source caps 220 and/or the p-n junctions between the pillars 210 and the respective drain caps 230 become forward-biased to draw charge from the pillars 210. The potentials 210E and 210F of the pillars 210 can fall to a level of Vin 1030 at time t12, Vin 1030 being a voltage drop across the forward-biased p-n junction.

The potential of the access lines 470 and 480 and the control gates 350 can begin to fall at time t14 to reach the reference voltage at time t16, marking the end of the program verify operation. Capacitive coupling between the control gates 350 and the pillars 210 cause the potentials 210E and 210F of the pillars 210 to begin to fall at time t14. The potentials 210E and 210F of the pillars 210 can fall to a negative potential 1094 that is below the reference voltage by time t16.

The charge pump circuit 240 can operate to raise the potential of the common source 126 and the source caps 220 of the deselected strings 410 and 420 a second time beginning at time t18 to reach the raised voltage 1060 (that is above the reference voltage). The potentials 210E and 210F of the pillars 210 begin to rise at time t18 to reach the potential level Vin 1030 at time t20. The raised voltage 1060 on the common source 126 induces GIDL current in the SGS transistors 120 of the deselected strings 410 and 420, and the resulting presence of excess holes can operate to raise the potentials 210E and 210F of the pillars 210. The potential of the common source 126 and the first caps 220 of the deselected strings 410 and 420 can be lowered to the reference voltage at time t22 after the pillars 210 have reached the potential level Vin 1030.

This second raising of the potential of the common source 126 to raise the potentials of pillars 210 to the level Vin 1030 provides a more suitable environment for an operation that follows the programming operation, lowering the incidence of irregularities.

Figure 11:
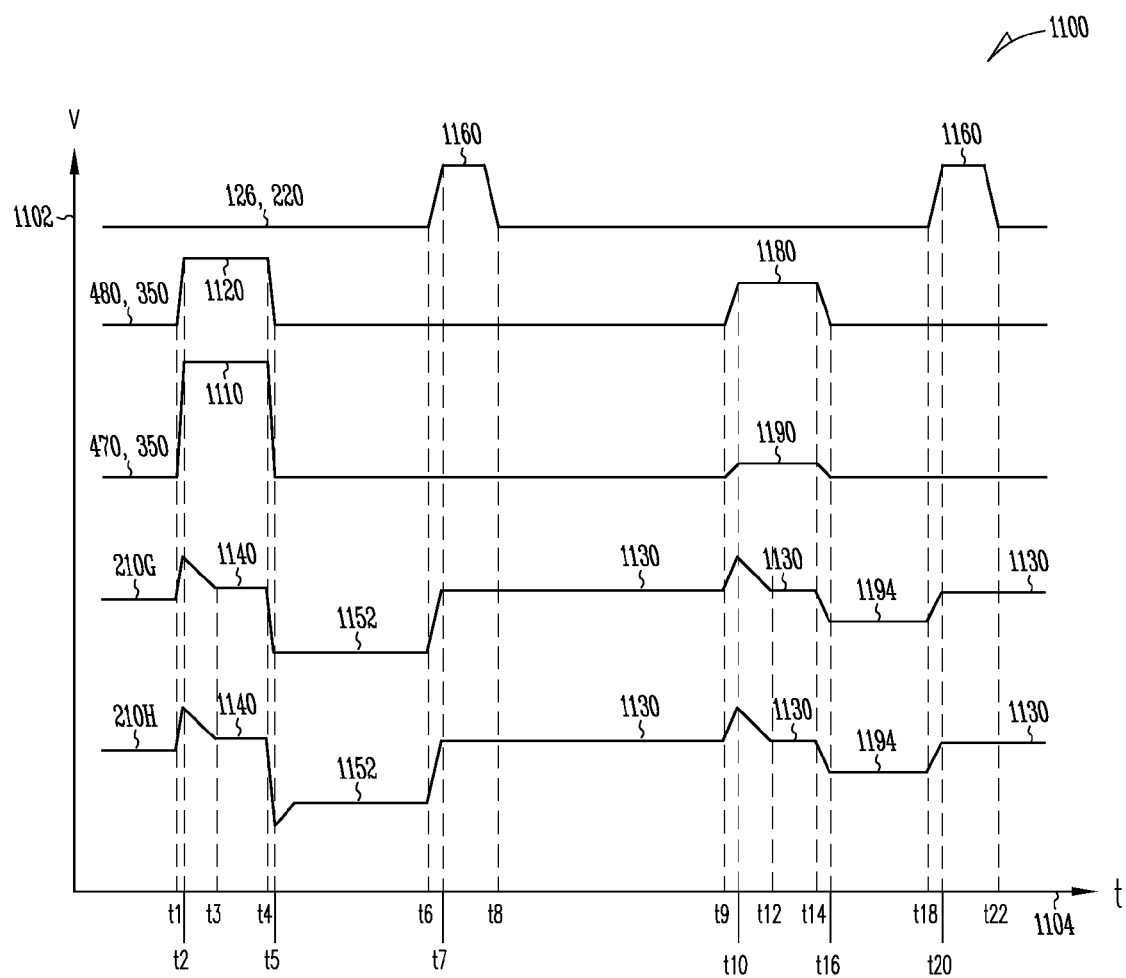
FIG. 11 is a timing diagram for the block of FIG. 4 for a programming operation according to various embodiments of the invention.

FIG. 11 is a timing diagram 1100 for the block 400 of FIG. 4 for a programming operation according to various embodiments of the invention. The timing diagram 1100 illustrates the potentials of the source cap 220 and the common source 126, the access lines 470 and 480 and the control gates 350 and 450 that are the same as the corresponding potentials of the programming operation shown in FIG. 10, and these potentials will not be further described for purposes of brevity. In the timing diagram 1100, the data line 134 is at the raised voltage Vcc and programming is inhibited. Voltage V is represented on a vertical axis 1102 and time t is represented on a horizontal axis 1104.

Potentials 210G and 210H of the pillars 210 of the deselected strings 410 and 420 when inhibited from programming are shown in the bottom portion of the timing diagram 1100. The potential 210G is the potential of the pillars 210 of the deselected strings associated with the unselected control gates 350 when the associated data line 134 is at a raised voltage Vcc provided by a voltage source (e.g., the charge pump circuit 240). The potential 210H is the potential of the pillars 210 of the deselected strings 410 and 420 associated with the selected control gates 350 when the associated data line 134 is at the raised voltage Vcc. The potentials 210G and 210H of the pillars 210 can fall to a level of Vin plus the raised voltage Vcc 1140 at time t3. The potential 210G of the pillars 210 can fall to a negative potential 1152, and the potential 210H of the pillars 210 stops falling and begins to rise to the negative potential 1152 at time t5. The charge pump circuit 240 can be used to raise the potential of the common source 126 and the source caps 220 of the strings 410 and 420, beginning at time t6, to reach the raised voltage 1060 that is above the reference voltage at time t7. The potentials 210G and 210H of the pillars 210 begin to rise at time t6, to reach the potential level Vin 1030 at time t7. The potentials 210G and 210H after time t7 are substantially similar to the potentials 210E and 210F shown in FIG. 10 and will not be further described herein for purposes of brevity.

Figure 12:
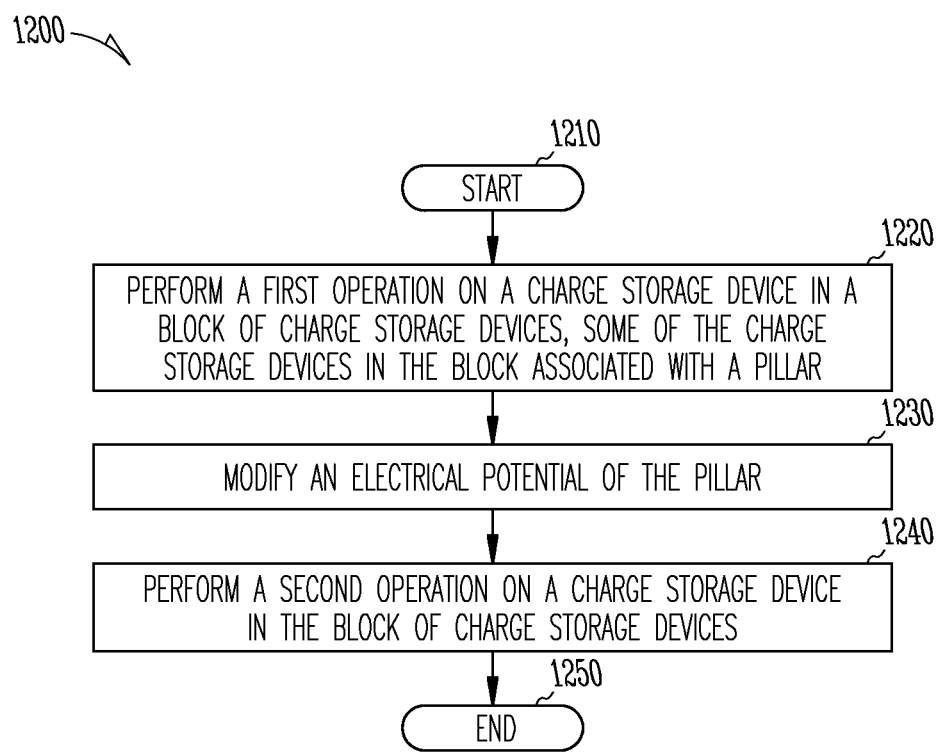
FIG. 12 is a flow diagram of a method according to various embodiments of the invention.

FIG. 12 is a flow diagram of a method 1200 according to various embodiments of the invention. In block 1210, the method 1200 starts. In block 1220, a first operation is performed on a charge storage device in a block of charge storage devices, some of the charge storage devices in the block being associated with a pillar comprising semiconductor material. In block 1230, an electrical potential of the pillar is modified according to the activities described with respect to FIGS.

5-9. In block 1240, a second operation is performed on a charge storage device in the block of charge storage devices. In block 1250, the method 1200 ends. Various embodiments may have more or fewer activities than those shown in FIG. 12. In some embodiments, the activities may be repeated, and/or performed in serial or parallel fashion. Some embodiments may comprise the same activities in a different order.

Figure 13:
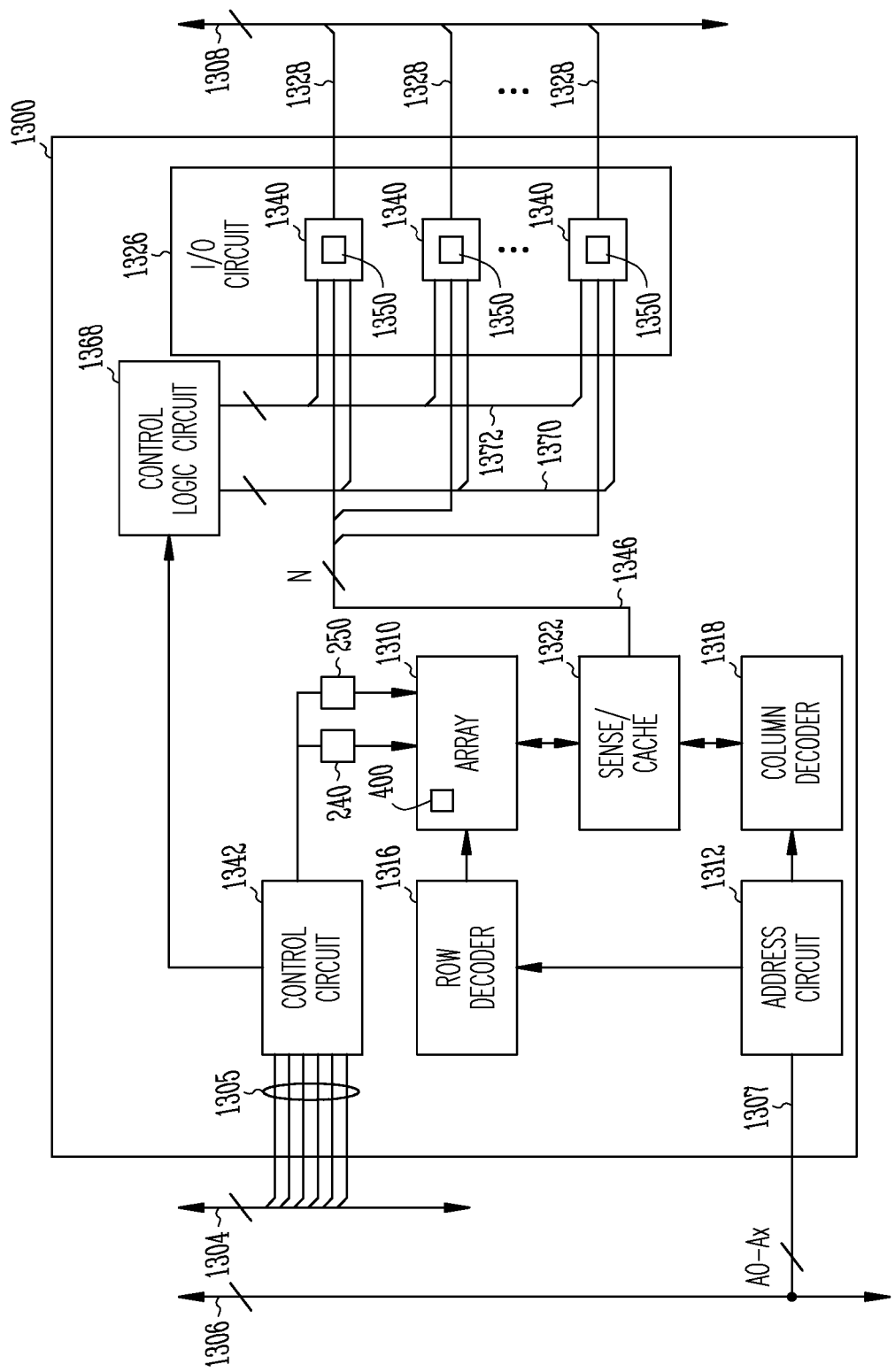
FIG. 13 is a block diagram of an apparatus in the form of a memory device according to various embodiments of the invention.

FIG. 13 is a block diagram of an apparatus in the form of a memory device 1300 according to various embodiments of the invention. The memory device 1300 is coupled to a control bus 1304 to receive multiple control signals over control signal lines 1305. The memory device 1300 is also coupled to an address bus 1306 to receive address signals A0-Ax on address signal lines 1307 and to a data bus 1308 to transmit and receive data signals. Although depicted as being received on separate physical busses, the data signals could also be multiplexed and received on the same physical bus.

The memory device 1300 includes one or more arrays 1310 of memory cells that can be arranged in rows and in columns. The memory cells of the array 1310 can be non-volatile memory cells (e.g., Flash memory cells with floating gate transistors or charge trap transistors) according to various embodiments of the invention. The memory device 1300 can be a NAND memory device. The array 1310 can include multiple banks and blocks of memory cells residing on a single die or on multiple dice as part of the memory device 1300. The memory cells in the array 1310 can be single level (SLC) or multilevel (MLC) memory cells, or combinations thereof. The array 1310 includes one or more of the block 400 of strings 100, 410 and 420 of charge storage devices 112 and 412 shown in FIG. 4 according to various embodiments of the invention. The charge pump circuits 240 and 250 are coupled to the array 1310.

An address circuit 1312 can latch the address signals A0-Ax received on the address signal lines 1307. The address signals A0-Ax can be decoded by a row decoder 1316 and a column decoder 1318 to access data stored in the array 1310. The memory device 1300 can read data in the array 1310 by sensing voltage or current changes in memory cells in the array 1310 using sense devices in a sense/cache circuit 1322.

A data input and output (I/O) circuit 1326 implements bi-directional data communication over external (e.g., data I/O) nodes 1328 coupled to the data bus 1308. The I/O circuit 1326 includes N driver and receiver circuits 1340 according to various embodiments of the invention. The memory device 1300 includes a controller that is configured to support operations of the memory device 1300, such as writing data to and/or erasing data from the array 1310. The controller can comprise, for example, control circuitry 1342 (e.g., configured to implement a state machine) on a same or different die than that which includes the array 1310 and/or any or all of the other components of the memory device 1300. The controller can comprise the control circuitry 1342, firmware, software or combinations of any or all of the foregoing. Data can be transferred between the sense/cache circuit 1322 and the I/O circuit 1326 over N signal lines 1346. The charge pump circuits 240 and 250 can be controlled by the controller. Embodiments of the invention shown in FIGS. 5-10 can be implemented using the controller.

Each driver and receiver circuit 1340 includes a driver circuit 1350. Control signals can be provided to the driver circuits 1350 (e.g., through control logic circuit 1368 that is coupled to the control circuitry 1342). The control logic circuit 1368 can provide the control signals over lines 1370 and 1372 to the driver circuits 1350.

Methods described herein can modify potentials of pillars in a block of strings of charge storage devices between operations such as read and programming operations. This can lead to a significant performance improvement, as well as increased operational reliability.

Example structures and methods of blocks of strings of charge storage devices have been described. Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method comprising:
performing a first operation on a first charge storage device in a block of charge storage devices, some of the charge storage devices in the block being associated with a pillar comprising semiconductor material;
inducing drain leakage current in a select gate transistor of the pillar to modify an electrical potential of the pillar; and
performing a second operation on a second charge storage device in the block of charge storage devices.

2. The method of claim 1, wherein inducing drain leakage current further comprises raising the electrical potential of the pillar.

3. The method of claim 1, wherein inducing drain leakage current further comprises lowering the electrical potential of the pillar.

4. The method of claim 1, wherein inducing drain leakage current further comprises causing electrical current to flow into the pillar.

5. The method of claim 1, wherein inducing drain leakage current further comprises causing excess holes in the pillar to be absorbed.

6. An apparatus comprising:
a string of charge storage devices comprising a plurality of charge storage devices and a select gate transistor associated with a pillar comprising semiconductor material;
a cap comprising semiconductor material and coupled to the pillar to form a p-n junction between the cap and the pillar;
a plurality of access lines associated with the string; and
a charge pump circuit coupled to the cap and configured to selectively cause drain leakage current to be induced in the select gate transistor to modify an electrical potential of the pillar after a first memory operation and prior to a second memory operation.

7. The apparatus of claim 6, wherein the select gate transistor comprises a source select gate transistor, the pillar comprises p-type semiconductor material, the cap comprises n-type semiconductor material, and wherein the string further comprises a drain select gate transistor.

8. The apparatus of claim 6, wherein each of the access lines at least partially surrounds a respective one of the charge storage devices and the pillar.

9. The apparatus of claim 6, wherein at least some of the charge storage devices comprise charge trap transistors.

10. The apparatus of claim 6, wherein at least some of the charge storage devices comprise floating gate transistors.

11. The apparatus of claim 6, wherein the apparatus comprises a system.

12. The apparatus of claim 6, wherein the apparatus comprises a memory device.

13. The apparatus of claim 6, wherein the select gate transistor comprises a source select gate transistor at least partially surrounding the pillar and configured to selectively couple the pillar to a source, and wherein the pillar further comprises a drain select gate transistor at least partially surrounding the pillar and configured to selectively couple the pillar to a data line.

14. A method comprising:
performing a first read operation on a charge storage device in a block of charge storage devices, each of the charge storage devices in the block being associated with a respective one of a plurality of pillars, each pillar comprising semiconductor material;
inducing drain leakage current in a select gate transistor of a selected one of the pillars to modify an electrical potential of the selected pillar; and
performing a second read operation on a charge storage device in the block of charge storage devices.

15. The method of claim 14, wherein inducing drain leakage current further comprises raising the electrical potential of the selected pillar.

16. The method of claim 14, wherein inducing drain leakage current comprises raising an electrical potential of a cap coupled to the selected pillar to induce gate-induced drain leakage (GIDL) current in the selected pillar, the selected pillar comprising semiconductor material and the cap comprising semiconductor material.

17. The method of claim 16, wherein inducing drain leakage current comprises inducing GIDL current in a source select gate transistor at least partially surrounding the selected pillar.

18. The method of claim 14, wherein inducing drain leakage current further comprises modifying an electrical potential of selected ones of the pillars that are floating during the first read operation.

19. A method comprising:
performing a first operation on a selected charge storage device in a block of charge storage devices, some of the charge storage devices in the block being associated with a pillar comprising semiconductor material;
lowering an electrical potential of the pillar; and
performing a read operation on the selected charge storage device in the block of charge storage devices.

20. The method of claim 19, wherein performing a first operation further comprises performing a plurality of page read operations on charge storage devices in the block of charge storage devices.

21. The method of claim 19, wherein performing a first operation further comprises performing a read operation on the selected charge storage device in the block of charge storage devices.

22. The method of claim 19, wherein lowering an electrical potential of the pillar further comprises forward biasing a p-n junction between a cap and the pillar.

23. The method of claim 19, wherein lowering an electrical potential of the pillar further comprises lowering an electrical potential of an n+ type cap coupled to the pillar to absorb holes in the cap, the pillar comprising a p+-type semiconductor material.

24. The method of claim 23, wherein lowering the electrical potential of the n+ type cap further comprises lowering the electrical potential of the n+ type cap with a charge pump circuit.

25. A method comprising:
performing a read operation on a charge storage device in a block of charge storage devices, some of the charge storage devices in the block being associated with a respective one of a plurality of pillars, each pillar comprising semiconductor material;
inducing drain leakage current in a select gate transistor of a selected one of the pillars to raise an electrical potential of the selected pillar; and
performing an erase operation on a charge storage device in the block of charge storage devices.

26. The method of claim 25, wherein inducing drain leakage current further comprises raising an electrical potential of a source coupled to the select gate transistor to induce GIDL current in the pillar.

27. The method of claim 26, wherein inducing drain leakage current further comprises inducing GIDL current in a source select gate transistor at least partially surrounding the selected pillar.

28. The method of claim 26, wherein inducing drain leakage current further comprises inducing GIDL current in a drain select gate transistor at least partially surrounding the selected pillar.

29. The method of claim 26, wherein raising the electrical potential of a source coupled to the select gate transistor comprises raising the electrical potential with a charge pump circuit.

30. The method of claim 25, wherein inducing drain leakage current further comprises raising an electrical potential of selected ones of the pillars that are floating during the read operation.

31. A method comprising:
performing a programming operation on a charge storage device in a block of charge storage devices, some of the charge storage devices in the block being associated with a respective one of a plurality of pillars, each pillar comprising semiconductor material;
inducing drain leakage current in a select gate transistor of a selected one of the pillars to modify an electrical potential of the selected pillar; and
performing a program verify operation on the charge storage device.

32. The method of claim 31, wherein inducing drain leakage current in a select gate transistor of a selected one of the pillars to modify an electrical potential of the selected pillar comprises raising the electrical potential of the selected pillar.

33. The method of claim 31, wherein inducing drain leakage current further comprises raising the electrical potential of a pillar associated with the charge storage device.

34. The method of claim 31, wherein inducing drain leakage current further comprises modifying an electrical potential of selected ones of the pillars that were floating during the programming operation.

35. The method of claim 31, further comprising modifying an electrical potential of a selected one of the pillars after the program verify operation.

* * * * *